(12) United States Patent
Kato

(10) Patent No.: US 7,692,799 B2
(45) Date of Patent: Apr. 6, 2010

(54) MEASUREMENT APPARATUS, EXPOSURE APPARATUS, AND DEVICE FABRICATION METHOD

(75) Inventor: Seima Kato, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 255 days.

(21) Appl. No.: 12/020,726

(22) Filed: Jan. 28, 2008

(65) Prior Publication Data
US 2008/0186509 A1 Aug. 7, 2008

(30) Foreign Application Priority Data
Feb. 6, 2007 (JP) .............................. 2007-027372

(51) Int. Cl.
*G01B 9/02* (2006.01)

(52) U.S. Cl. ...................................... 356/515

(58) Field of Classification Search ................. 356/124, 356/515, 511, 512, 520, 521
See application file for complete search history.

(56) References Cited

U.S. PATENT DOCUMENTS

| | | | |
|---|---|---|---|
| 6,573,997 B1 * | 6/2003 | Goldberg et al. ............ | 356/521 |
| 7,304,749 B2 * | 12/2007 | Ohkubo ....................... | 356/521 |
| 7,352,475 B2 * | 4/2008 | Hasegawa .................... | 356/515 |
| 7,417,745 B2 * | 8/2008 | Haidner et al. .............. | 356/515 |
| 7,518,735 B2 * | 4/2009 | Tezuka ........................ | 356/515 |
| 2003/0215053 A1 * | 11/2003 | Ichihara ....................... | 378/36 |

FOREIGN PATENT DOCUMENTS

| JP | 2006-196699 | 7/2006 |
|---|---|---|
| JP | 2006-332586 | 12/2006 |

* cited by examiner

*Primary Examiner*—Hwa S. A Lee
(74) *Attorney, Agent, or Firm*—Rossi, Kimms & McDowell LLP

(57) ABSTRACT

The invention provides a measurement apparatus which measures a wavefront aberration of an optical system to be measured, the apparatus includes a measurement mask which is inserted on an object plane of the optical system to be measured, and includes a plurality of reflection units configured to generate spherical waves by reflecting light, the measurement mask including a reflection layer configured to reflect the light, a first layer which is stacked on the reflection layer, has a plurality of openings, and is made of a first substance, and a second layer which is stacked on the first layer, has a window configured to expose a region in which the plurality of openings are arrayed, and is made of a second substance different from the first substance, wherein the plurality of reflection units are formed by portions of the reflection layer, which are exposed through the plurality of openings.

7 Claims, 14 Drawing Sheets

MEASUREMENT APPARATUS, EXPOSURE APPARATUS, AND DEVICE FABRICATION METHOD

BACKGROUND OF THE INVENTION

1. Field of the Invention

The present invention relates to a measurement apparatus, an exposure apparatus, and a device fabrication method.

2. Description of the Related Art

A projection exposure apparatus has conventionally been employed to fabricate, e.g., a semiconductor device and liquid crystal display device by using photolithography. The projection exposure apparatus transfers a pattern formed on a mask (reticle) onto, e.g., a wafer via a projection optical system.

In recent years, to attain further micropatterning of semiconductor devices, the practical application of a projection exposure apparatus (EUV exposure apparatus) using EUV (Extreme UltraViolet) light (wavelength: about 10 nm to 15 nm) having a wavelength shorter than that of ultraviolet light is under study. Since light absorption is great in various substances in the EUV wavelength range, a dioptric system using light refraction is impractical. For this reason, the EUV exposure apparatus uses a catoptric system using light reflection as the projection optical system. To exactly transfer the pattern of a mask at a predetermined magnification, it is necessary to suppress the wavefront aberration of the projection optical system to $\lambda/14$ (=0.96 nm) rms or less on the basis of the Marechal standard.

Accurate control of a projection optical system on an exposure apparatus requires a technique of accurately measuring the wavefront aberration of the projection optical system. A lateral shearing interferometer has conventionally been known as a measurement apparatus which measures the wavefront aberration of the projection optical system used for the exposure apparatus. Techniques associated with this apparatus are disclosed in Japanese Patent Laid-Open Nos. 2006-332586 and 2006-196699.

Unfortunately, a laser produced plasma light source (LPP) and discharge produced plasma light source (DPP), which are often used as light sources of EUV exposure apparatuses, emit light beams with low directivities. This makes it very difficult to selectively converge such a light beam only on a reflection unit which generates an ideal spherical wave. Since even a region (light-shielding region) other than the reflection unit is irradiated with the light beam, a signal noise ratio (S/N ratio) necessary for wavefront aberration measurement cannot sometimes be obtained due to the light beam reflected by the light-shielding region. In other words, the light beam reflected by the light-shielding region acts as noise of an interference pattern. This makes it impossible to accurately measure the wavefront aberration of an optical system to be measured.

SUMMARY OF THE INVENTION

The present invention provides a measurement apparatus which can accurately measure the optical performances (wavefront aberration) of an optical system to be measured, by reducing noise of an interference pattern.

According to one aspect of the present invention, there is provided a measurement apparatus which measures a wavefront aberration of an optical system to be measured, the apparatus comprises a measurement mask which is inserted on an object plane of the optical system to be measured, and includes a plurality of reflection units configured to generate spherical waves by reflecting light, a diffractive optical element configured to diffract the light having passed through the measurement mask and the optical system to be measured, and a detection unit configured to detect an interference pattern formed by interference of the light diffracted by the diffractive optical element, the measurement mask including a reflection layer configured to reflect the light, a first layer which is stacked on the reflection layer, has a plurality of openings, and is made of a first substance, and a second layer which is stacked on the first layer, has a window configured to expose a region in which the plurality of openings are arrayed, and is made of a second substance different from the first substance, wherein the plurality of reflection units are formed by portions of the reflection layer, which are exposed through the plurality of openings.

According to another aspect of the present invention, there is provided an exposure apparatus comprising an illumination optical system configured to illuminate a mask with light from a light source, a projection optical system configured to project a pattern of the mask onto a substrate, and the above measurement apparatus which measures a wavefront aberration of the projection optical system as an optical system to be measured.

According to still another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

DESCRIPTION OF THE EMBODIMENTS

Figure 1:
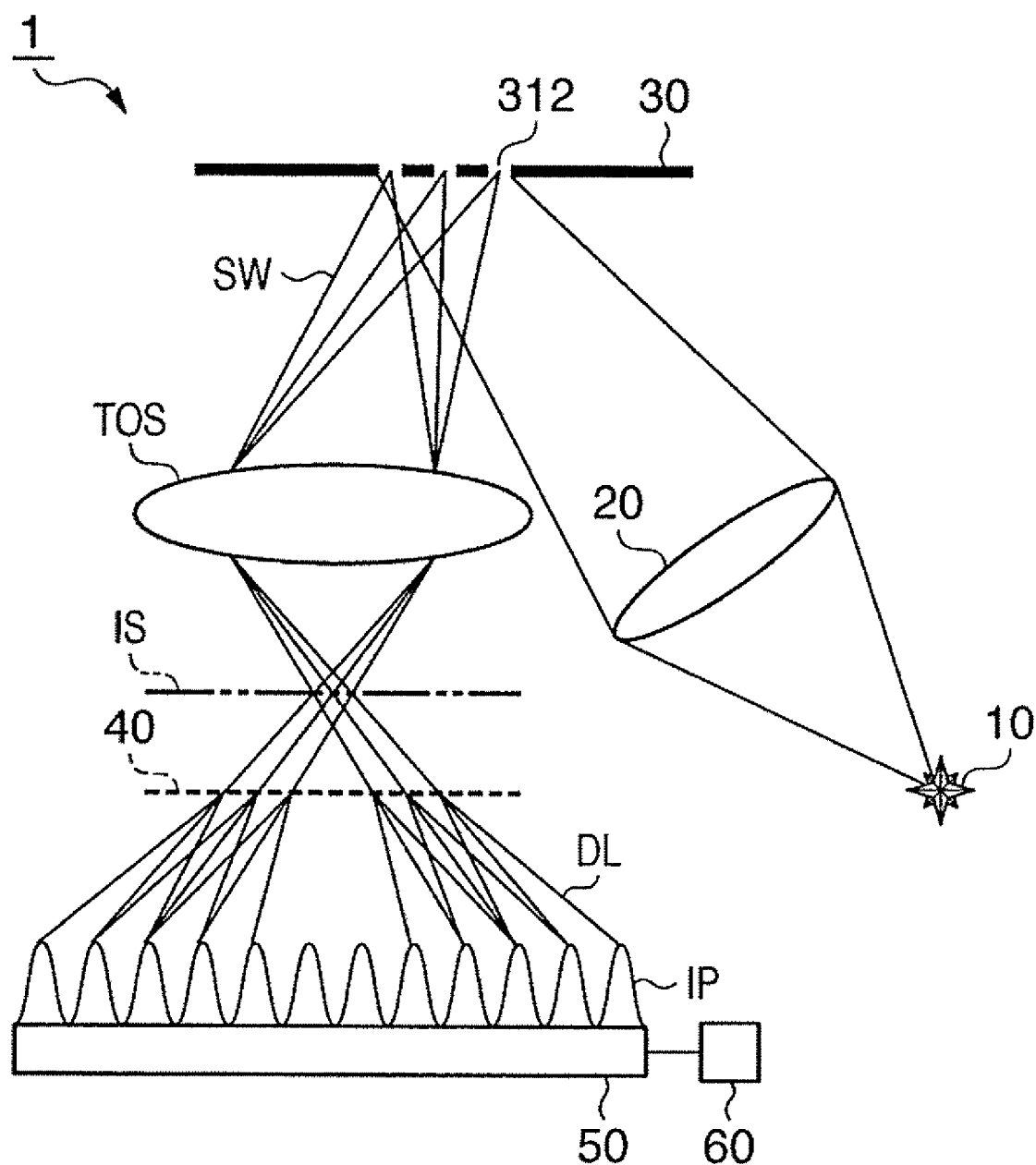
FIG. 1 is a schematic sectional view of a measurement apparatus according to one aspect of the present invention.

With reference to the accompanying drawings, a description will now be given of a measurement apparatus of one embodiment according to the present invention. The same reference numeral in each figure denotes the same element, and a duplicate description thereof will be omitted. Here, FIG. 1 is a schematic sectional view of an exposure apparatus according to the present invention.

FIG. 1 is a schematic sectional view showing a measurement apparatus 1 according to the present invention. The measurement apparatus 1 measures the optical performances of an optical system TOS to be measured. In this embodiment, the optical system TOS to be measured is a projection optical system used for an EUV exposure apparatus, and the measurement apparatus 1 is exemplified as a lateral shearing interferometer which measures the wavefront aberration of the projection optical system. As shown in FIG. 1, the measurement apparatus 1 includes a light source unit 10, an illumination optical system 20, a measurement mask (reticle) 30, a diffraction grating 40 serving as a diffractive optical element for diffracting EUV light, a detection unit 50, and an analysis unit 60.

The light source unit 10 generates EUV light to illuminate the measurement mask 30. The light source unit 10 uses a light source similar to that of an EUV exposure apparatus using a projection optical system as the optical system TOS to be measured. For example, the light source unit 10 uses a laser produced plasma light source (LPP) or discharge produced plasma light source (DPP) as the light source.

The illumination optical system 20 illuminates the measurement mask 30 with the EUV light from the light source unit 10, and includes various optical elements such as a plane mirror.

The measurement mask 30 is inserted on the object plane of the optical system TOS to be measured, and includes a plurality of reflection units 312 which reflect the EUV light from the light source unit 10 to generate ideal spherical waves SW. The measurement mask 30 will be described in detail later.

The diffraction grating 40 diffracts the light having passed through the measurement mask 30 and the optical system TOS to be measured. In this embodiment, the diffraction grating 40 is a two-dimensional diffraction grating having a two-dimensional structure. The diffraction grating 40 is inserted between an image plane IS and the detection unit 50, and diffracts the light from the image plane IS into a plurality of light beams DL. However, the diffraction grating 40 may be inserted between the optical system TOS to be measured and the image plane IS. The plurality of diffracted light beams DL form an interference pattern IP on the detection unit 50.

To obtain an interference pattern IP with a high contrast, the diffraction grating 40 must be arranged such that the Talbot effect appears. More specifically, the diffraction grating 40 is arranged such that a distance Lg between the image plane IS and the diffraction grating 40 satisfies:

$$Lg = m \cdot Pg^2 / \lambda \qquad (1)$$

where Pg is the diffraction pitch of the diffraction grating 40, $\lambda$ is the wavelength of measurement light (i.e., EUV light emitted by the light source unit 10), and m is a nonzero integer.

The detection unit 50 detects an interference pattern IP formed by interference between the light beams DL diffracted by the diffraction grating 40. The detection unit 50 is formed by, e.g., an image sensor (optical sensor) such as a CCD sensor.

The analysis unit 60 analyzes the detection result (i.e., the interference pattern IP detected by the detection unit 50) obtained by the detection unit 50, to derive the wavefront aberration (wavefront information) of the optical system TOS to be measured. More specifically, the analysis unit 60 processes the interference pattern IP to restore the wavefront of the optical system TOS to be measured. For example, the analysis unit 60 calculates the wavefront derivatives in two orthogonal directions of the diffraction grating 40. The analysis unit 60 then integrates the resultant wavefront derivatives in two orthogonal directions of the diffraction grating 40 and composites them to restore the wavefront of the optical system TOS to be measured.

The measurement apparatus 1 guides the EUV light from the light source unit 10 to illuminate the measurement mask 30 on the object plane of the optical system TOS to be measured, via the illumination optical system 20. The ideal spherical waves SW reflected by the reflection units 312 of the measurement mask 30 converge on the image plane IS via the optical system TOS to be measured. The ideal spherical waves SW having passed through the image plane IS are diffracted into a plurality of light beams DL by the diffraction grating 40, and are detected as an interference pattern IP on the detection unit 50.

Figure 2:
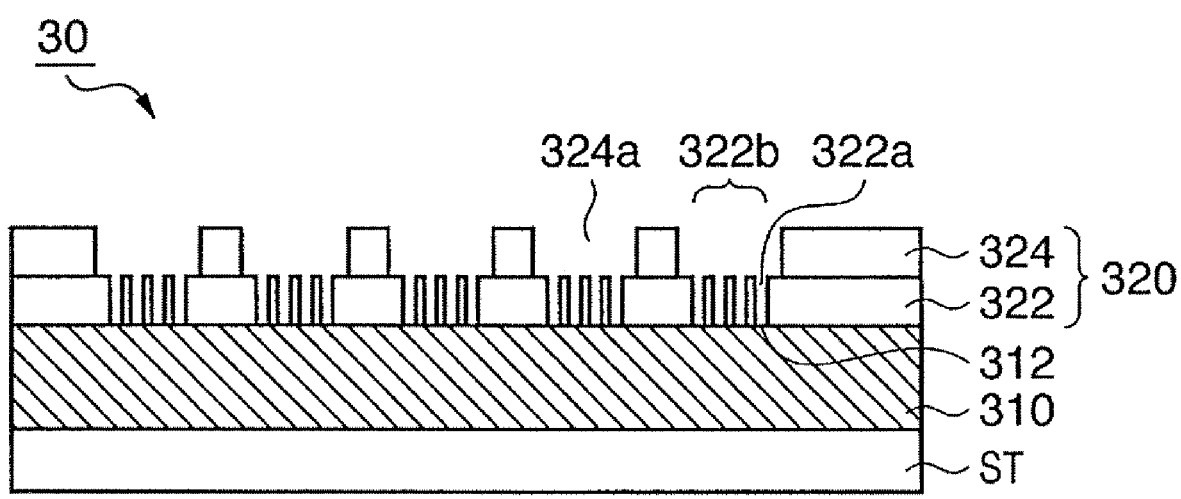
FIG. 2 is a schematic sectional view of a measurement mask of the measurement apparatus shown in FIG. 1.
Figure 3:
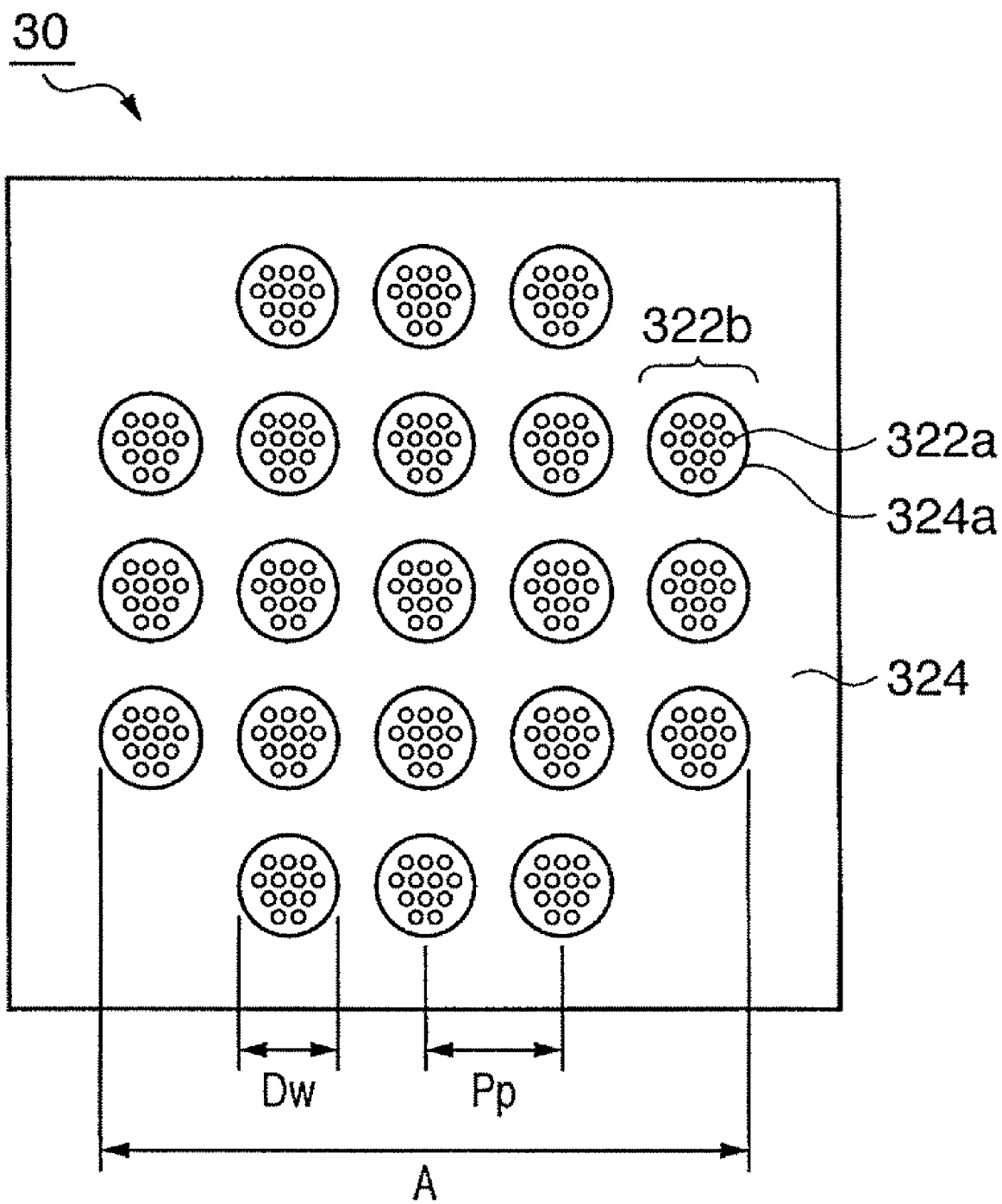
FIG. 3 is a schematic plan view of a measurement mask of the measurement apparatus shown in FIG. 1.

The measurement mask 30 will be explained in detail with reference to FIGS. 2 and 3. FIG. 2 is a schematic sectional view showing the structure of the measurement mask 30. FIG. 3 is a schematic plan view showing the structure of the measurement mask 30. As shown in FIG. 2, the measurement mask 30 has a substrate ST made of, e.g., Si (silicon) or glass, a reflection layer 310, and a light-shielding layer 320.

The reflection layer 310 is formed on the substrate ST and reflects the EUV light from the light source unit 10 and illumination optical system 20. In this embodiment, the reflection layer 310 is formed by an Mo/Si multilayer film in which Mo (molybdenum) and Si (silicon) are alternately stacked. The reflection layer 310 forms a plurality of reflection units 312, as will be described later. The plurality of reflection units 312 have an area to generate ideal spherical waves by reflecting the EUV light.

The light-shielding layer 320 shields the EUV light from the light source unit 10 and illumination optical system 20, and includes an absorption layer (first layer) 322 and antireflection layer (second layer) 324, as shown in FIG. 2.

The absorption layer 322 is formed on the reflection layer 310 and has a plurality of openings (pinholes in this embodiment) 322a. The plurality of openings 322a of the absorption layer 322 partially expose the reflection layer 310. Portions of the reflection layer 310, which are exposed through the plurality of openings 322a, form reflection units 312. The absorption layer 322 has regions (opening groups) 322b in each of which a plurality of openings 322a are arrayed. In this embodiment, the absorption layer 322 has the plurality of opening groups 322b, as shown in FIG. 3. The plurality of openings 322a are arrayed such that the light beams reflected by reflection units 312 exposed through adjacent openings 322a do not interfere with each other.

The absorption layer 322 is made of a substance (first substance) which efficiently absorbs the EUV light (internally absorbs the EUV light). The substance of the absorption layer 322 is preferably Ni (nickel), Ta (tantalum), TaBN (tantalum boron nitride), or Cr (chromium). A thickness of the absorption layer 322 is about 100 nm to 150 nm. For example, the absorption layer 322 must have a thickness of 100 nm or more if it is made of TaBN.

The antireflection layer 324 is formed on the absorption layer 322, and has windows 324a which expose the regions (opening groups) 322b in each of which a plurality of openings 322a of the absorption layer 322 are arrayed. The antireflection layer 324 is not formed in the regions (opening groups) 322b in each of which a plurality of openings 322a of the absorption layer 322 are arrayed (i.e., the vicinities of the reflection units 312). This makes it possible to prevent attenuation of the light beams reflected by the reflection units 312 and wavefront disturbance produced by the reflection units 312 attributed to the fact that the reflection units 312 are formed by two layers, i.e., the absorption layer 322 and antireflection layer 324.

The antireflection layer 324 is made of a substance (second substance) different from the substance (first substance) of the absorption layer 322. For example, the antireflection layer 324 is made of a substance which suppresses the surface reflection of the EUV light from the light source unit 10 and illumination optical system 20 (suppresses the reflection of the EUV light by the outermost surface of the antireflection layer 324). The substance of the antireflection layer 324 is preferably a substance having a refractive index of one to EUV light, such as Si (silicon) or $SiO_2$ (silicon dioxide). A thickness of the antireflection layer 324 is larger than that of the absorption layer 322. For example, the antireflection layer 324 must have a thickness of 640 nm if it is made of Si, while it must have a thickness of 200 nm if it is made of $SiO_2$.

As described above, the reflection unit 312 of the measurement mask 30 includes holes (openings 322a and windows 324a) extending through the absorption layer 322 and antireflection layer 324. Note that the numbers of openings 322a (opening groups 322b) and windows 324a shown in FIGS. 2 and 3 are merely schematic examples, and are not particularly limited to them.

Each of the plurality of openings 322a of the absorption layer 322 has a diameter equal to or smaller than the diffraction limit of the projection optical system as the optical system TOS to be measured. If, for example, the NA and magnification of the projection optical system as the optical system TOS to be measured are 0.25 and ¼, respectively, the NA, on the incident side, of the optical system TOS to be measured is 0.0625. Then, the diameter of the opening 322a to cover a diffraction angle in this range with diffracted light having almost no aberration is 13.5/(2×0.0625)=108 nm. The intervals between the plurality of openings 322a are equal to or larger than the spatial coherence length of the EUV light from the light source unit 10.

A pitch Pp between the windows 324a of the antireflection layer 324 satisfies:

$$Pp=(Pg/\beta)\cdot(Lc/(Lc-Lg)) \quad (2)$$

where β is the magnification of the optical system TOS to be measured, Lc is the distance between the detection unit 50 and the image plane IS of the optical system TOS to be measured, and Lg is the distance between the diffraction grating 40 and the image plane IS of the optical system TOS to be measured.

This makes it possible to match, on the detection unit 50, bright and dark positions of an interference pattern IP formed by interference between the light beams reflected by the reflection units 312 formed by the plurality of openings 322a of the absorption layer 322, thus preventing contrast deterioration. As in this embodiment, when the diffraction grating 40 is inserted under the image plane IS of the optical system TOS to be measured, the distance Lg has a negative sign.

When a diameter Dw of the window 324a of the antireflection layer 324 becomes larger, it is possible to increase the total number of reflection units 312 (openings 322a of the absorption layer 322) exposed through the windows 324a. This makes it possible to measure the wavefront aberration of the optical system TOS to be measured, with relatively a small amount of EUV light. However, the contrast of the interference pattern IP detected by the detection unit 50 deteriorates. This makes it necessary to set the diameter Dw of the window 324a by take account of the intensity and contrast deterioration of the interference pattern IP.

For example, if the pitch Pp between the windows 324a is 3.5 μm, the diameter Dw of the window 324a is preferably 2.1 μm, which is 0.6 times the window pitch Pp. In this case, the contrast of the interference pattern IP deteriorates to 60% of that when one window 324a includes one reflection unit 312 (opening 322a). However, if the interval between the reflection units 312 (openings 322a) is 0.16 μm, one window 324a includes about 160 reflection units 312 (openings 322a). This makes it possible to obtain an interference pattern IP having a light intensity about 160 times that when one window 324a includes one reflection unit 312 (opening 322a).

In general, light beams from two different points on the transfer region (image plane IS) of the optical system TOS to be measured form interference patterns having different shapes. The shape of an interference pattern changes in accordance with the wavefront aberration characteristic of the optical system TOS to be measured. The longer the distance between the two points, the larger the change of the interference pattern. For this reason, the distribution of the reflection units 312 (openings 322a) which reflect the EUV light must be limited to a region within which the aberration of the optical system TOS to be measured is almost uniform, i.e., the so-called isoplanatic region. In this embodiment, a size A of a region in which the reflection units 312 (openings 322a) are formed is equal to that of a region within which the aberration of the optical system TOS to be measured is almost uniform, typically a diameter of about 0.1 mm to 1 mm.

Figure 4:
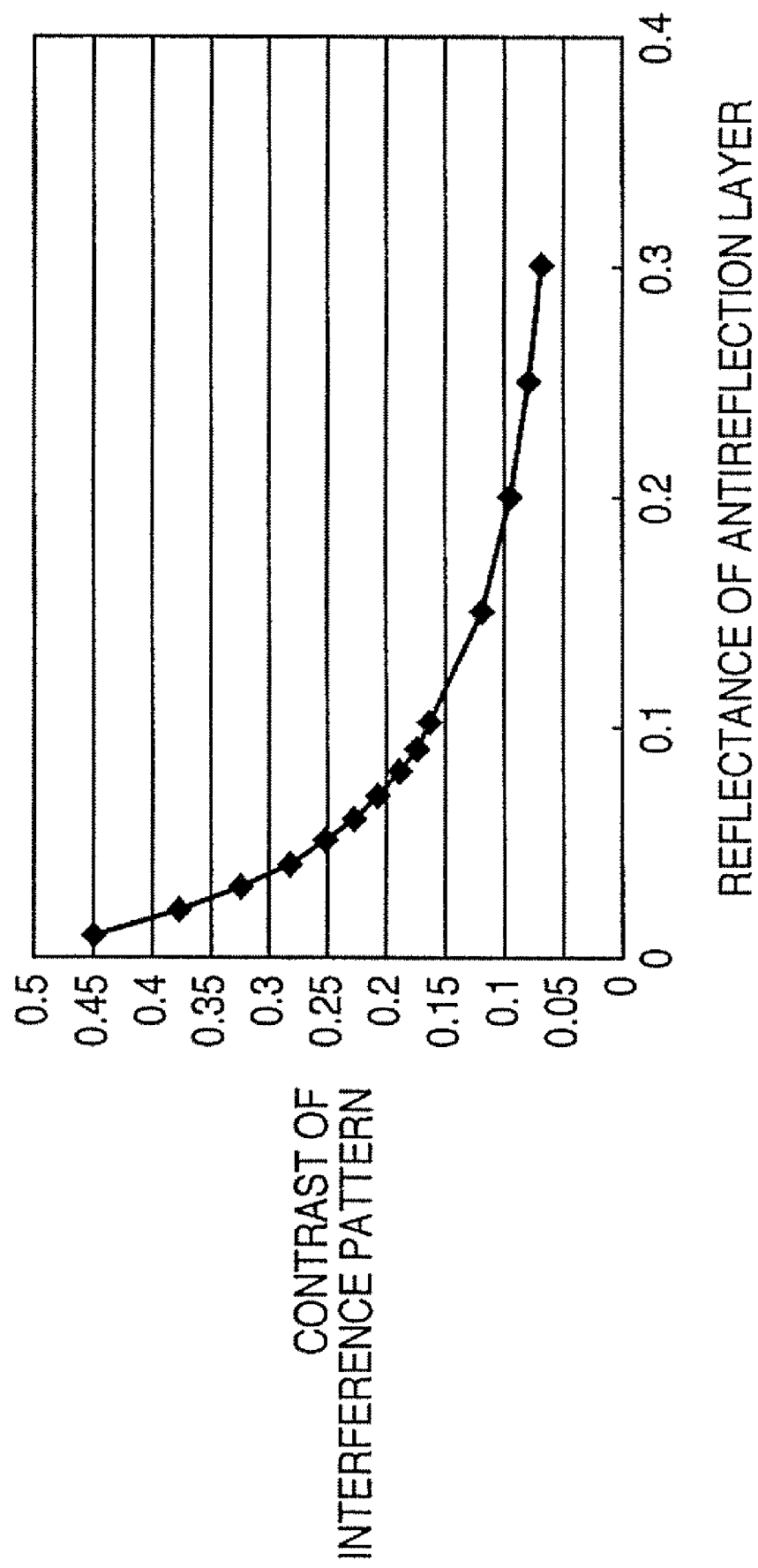
FIG. 4 is a graph showing the relationship between the reflectance of an antireflection layer of the measurement mask and the contrast of an interference pattern on a detection unit in the measurement apparatus shown in FIG. 1.

FIG. 4 is a graph showing the relationship between the reflectance of the antireflection layer 324 and the contrast of the interference pattern IP on the detection unit 50. FIG. 4 exemplifies a case in which the size A of the region in which the reflection units 312 (openings 322a) are formed is 200 μm, the area ratio of the openings 322a in the region in which they are arrayed is 0.1, and the diameter Dw of the window 324a is 2.1 μm. To restore the wavefront aberration (phase) of the optical system TOS to be measured, on the basis of the interference pattern IP detected by the detection unit 50 without generating any errors, the interference pattern IP preferably has a contrast of 0.3 or more. If, however, the measurement apparatus fluctuates noise components by only small amounts, the wavefront aberration (phase) of the optical system TOS to be measured can sometimes be correctly restored even when the contrast of the interference pattern is about 0.2. Referring to the correspondence between the contrast of the interference pattern IP and the reflectance of the antireflection layer 324 shown in FIG. 4, it is necessary to use a measurement mask 30 in which the reflectance of the antireflection layer 324 is 0.07% or less at maximum and, preferably, 0.03% or less.

Figure 5:
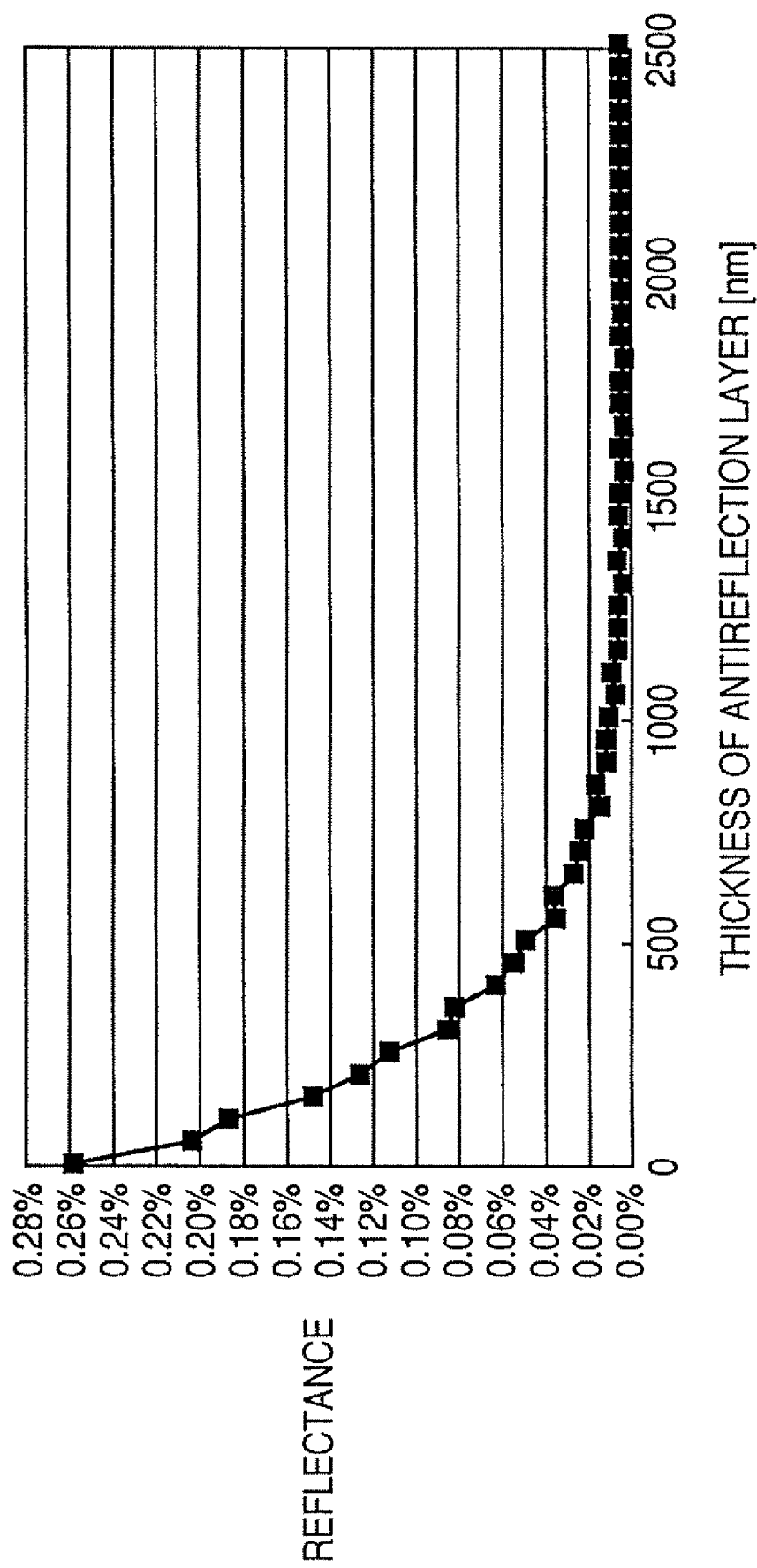
FIG. 5 is a graph showing the relationship between the thickness and reflectance (surface reflection) of an antireflection layer, which is made of Si, of the measurement mask in the measurement apparatus shown in FIG. 1.

FIG. 5 is a graph showing the relationship between the thickness and reflectance (surface reflection) of an antireflection layer 324 made of Si. FIG. 5 shows the reflectance of the antireflection layer 324 when a TaBN absorption layer 322 is formed on an Mo/Si multilayer (40 layer pairs) reflection layer 310, and an Si antireflection layer 324 is formed on the TaBN. The reflectance of the antireflection layer 324 changes even due to a very small fluctuation of the thickness of the TaBN absorption layer 322. However, it is relatively difficult to control the film thickness of the antireflection layer 324 on the order of nanometer. FIG. 5 shows plots of the worst values, i.e., the maximum values of the reflectance of the antireflection layer 324 when the film thickness of the TaBN absorption layer 322 is changed from 145 nm to 155 nm. FIG. 5 reveals that the thickness of the Si antireflection layer 324 must be 400 nm or more at minimum and, preferably, 640 nm or more to suppress its reflectance to 0.07% or less or 0.03% or less.

Figure 6:
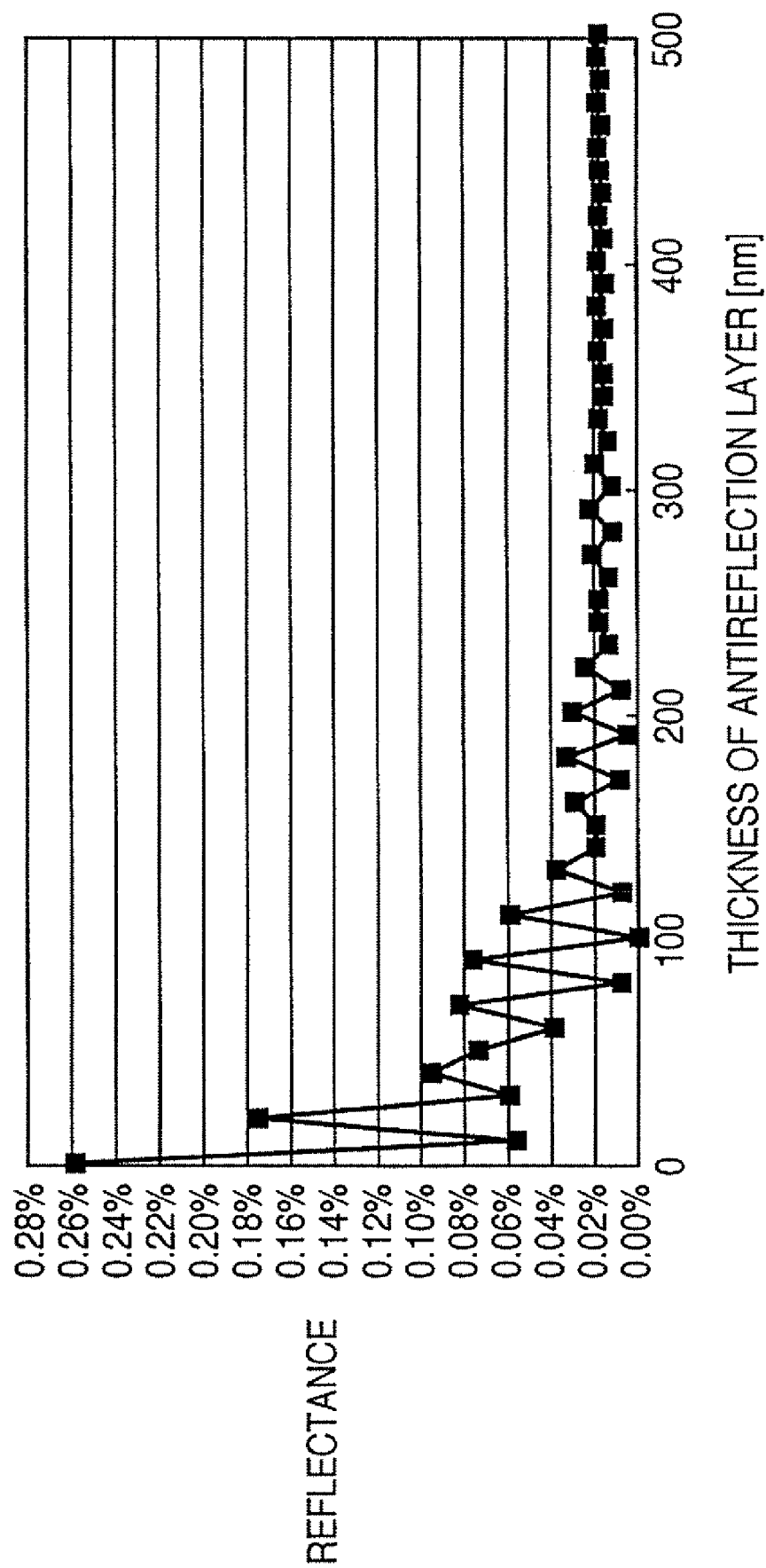
FIG. 6 is a graph showing the relationship between the thickness and reflectance (surface reflection) of an antireflection layer, which is made of $SiO_2$, of the measurement mask in the measurement apparatus shown in FIG. 1.

FIG. 6 is a graph showing the relationship between the thickness and reflectance (surface reflection) of an antireflection layer 324 made of $SiO_2$. FIG. 6 shows the reflectance of the antireflection layer 324 when a TaBN absorption layer 322 is formed on an Mo/Si multilayer (40 layer pairs) reflection layer 310, and an $SiO_2$ antireflection layer 324 is formed on the TaBN. FIG. 6 reveals that the thickness of the $SiO_2$ antireflection layer 324 must be 100 nm or more at minimum and, preferably, 200 nm or more to suppress its reflectance to 0.07% or less or 0.03% or less.

In this manner, the light-shielding layer 320 of the measurement mask 30 is formed by two layers, i.e., the absorption layer 322 which absorbs the EUV light and the antireflection layer 324 which prevents the surface reflection of the EUV light. This makes it possible to reduce noise of the interference pattern IP detected by the detection unit 50. Hence, the measurement apparatus 1 can accurately measure the optical performances (wavefront aberration) of the optical system TOS to be measured.

A method for fabricating a measurement mask 30 will be explained with reference to FIGS. 7A to 7D. FIGS. 7A to 7D are schematic sectional views for explaining an example of the method for fabricating the measurement mask 30. In the method for fabricating the measurement mask 30 shown in FIGS. 7A to 7D, an absorption layer 322 and antireflection layer 324 are separately formed and bonded.

Figure 7A:
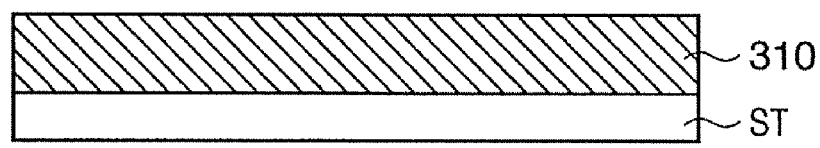
FIGS. 7A to 7D are views for explaining an example of a method for fabricating the measurement mask of the measurement apparatus shown in FIG. 1.
Figure 7B:
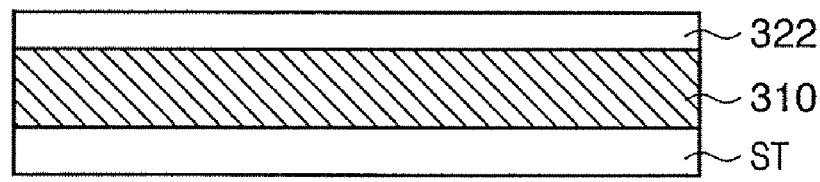
Figure 7C:
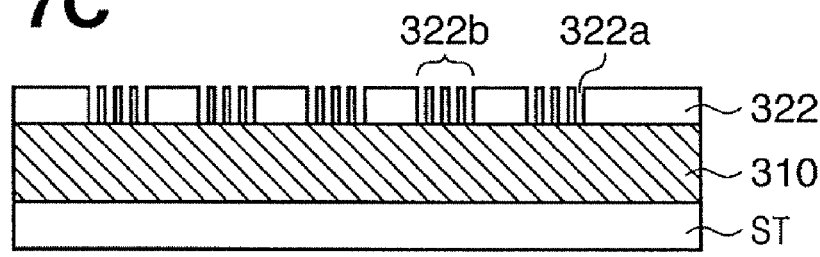

As shown in FIG. 7A, an Mo/Si multilayer reflection layer 310 is formed on a substrate ST. As shown in FIG. 7B, a TaBN absorption layer 322 is formed on the reflection layer 310. As shown in FIG. 7C, the TaBN absorption layer 322 is etched to form a plurality of openings 322a.

Figure 7D:
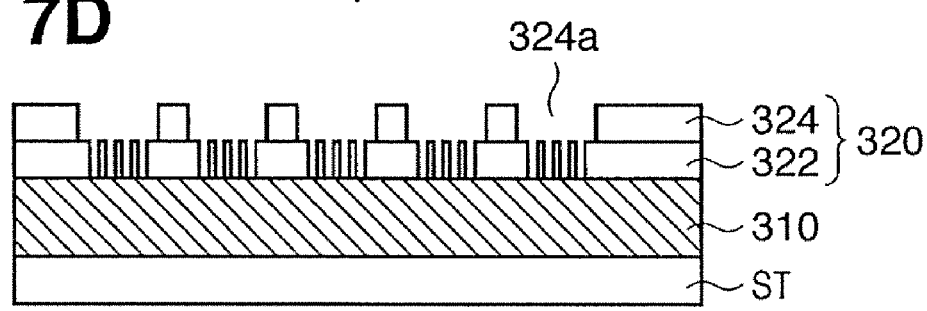

Separately from the absorption layer 322, an antireflection layer 324 in which windows 324a are formed is formed. The windows 324a expose regions (opening groups) 322b in each of which a plurality of openings 322a of the absorption layer 322 are arrayed. The antireflection layer 324 and absorption layer 322 are bonded to fabricate a measurement mask 30, as shown in FIG. 7D.

The method for fabricating the measurement mask 30 shown in FIGS. 7A to 7D can form an antireflection layer 324 after it is found that the influence of the absorption layer 322 (a light-shielding layer 320) is nonnegligible. To reduce the influence of the positional shift between the antireflection layer 324 and absorption layer 322 upon bonding them, a diameter Dw of the window 324a is desirably larger by several hundreds of nanometers than the region (opening group) 322b in which the plurality of openings 322a are arrayed.

It is also possible to fabricate a measurement mask 30 by a method shown in FIGS. 8A to 8E. FIGS. 8A to 8E are schematic sectional views for explaining another example of the method for fabricating the measurement mask 30. In the method for fabricating the measurement mask 30 shown in FIGS. 8A to 8E, windows 324a are formed after forming an antireflection layer 324.

Figure 8A:
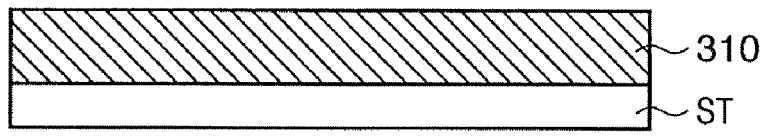
FIGS. 8A to 8E are views for explaining another example of the method for fabricating the measurement mask of the measurement apparatus shown in FIG. 1.
Figure 8B:
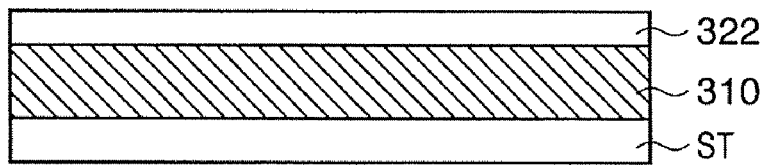
Figure 8C:
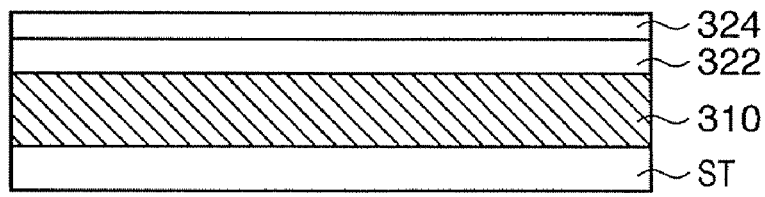

As shown in FIG. 8A, an Mo/Si multilayer reflection layer 310 is formed on a substrate ST. As shown in FIG. 8B, a TaBN absorption layer 322 is formed on the reflection layer 310. As shown in FIG. 8C, an antireflection layer 324 is formed on the TaBN absorption layer 322.

Figure 8D:
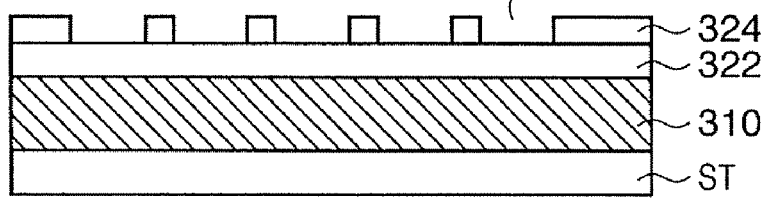
Figure 8E:
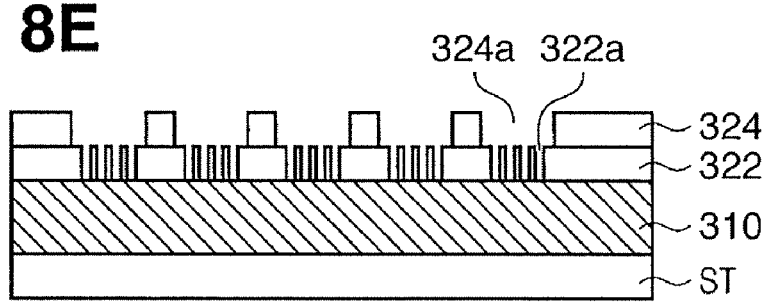

As shown in FIG. 8D, windows 324a are formed in the antireflection layer 324 at, e.g., the above-described pitch Pp. As shown in FIG. 8E, the TaBN absorption layer 322 is etched to form a plurality of openings 322a in each window 324a, thereby fabricating a measurement mask 30.

The method for fabricating the measurement mask 30 shown in FIGS. 8A to 8E can form a plurality of openings 322a in each window 324a with small size errors.

Figure 9:
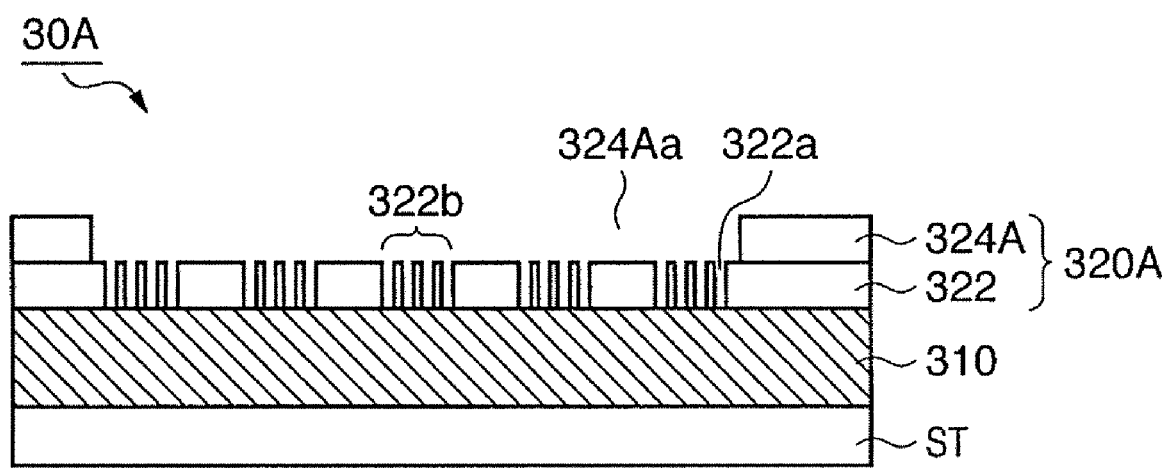
FIG. 9 is a schematic sectional view showing a measurement mask applicable to the measurement apparatus shown in FIG. 1.
Figure 10:
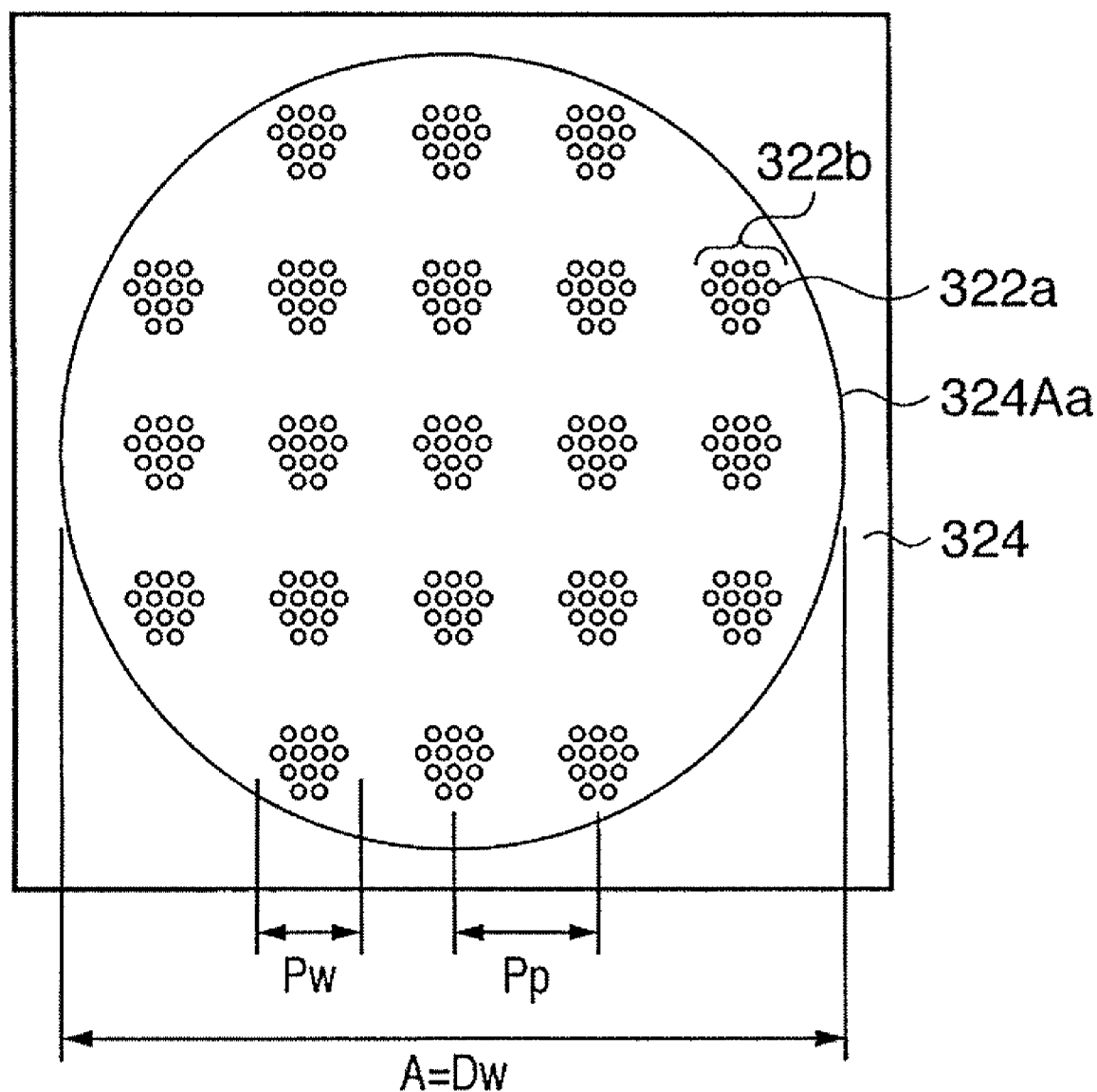
FIG. 10 is a schematic plan view showing the structure of the measurement mask applicable to the measurement apparatus shown in FIG. 1.

The measurement apparatus 1 may use a measurement mask 30A shown in FIGS. 9 and 10, in place of the measurement mask 30 shown in FIGS. 2 and 3. The measurement mask 30A has a structure simpler than that of the measurement mask 30. The measurement mask 30A is different from the measurement mask 30 in the structure of a light-shielding layer 320A and, more specifically, the structure of an antireflection layer 324A. As shown in FIG. 9, the measurement mask 30A has a substrate ST made of, e.g., Si or glass, a reflection layer 310, and a light-shielding layer 320A. FIG. 9 is a schematic sectional view showing the structure of the measurement mask 30A. FIG. 10 is a schematic plan view showing the structure of the measurement mask 30A.

The light-shielding layer 320A shields EUV light from a light source unit 10 and illumination optical system 20, and has an absorption layer 322 and the antireflection layer 324A.

In this embodiment, as shown in FIGS. 9 and 10, the antireflection layer 324A has a window 324Aa which collectively expose a plurality of regions (opening groups) 322b in which a plurality of openings 322a of the absorption layer 322 are arrayed.

A diameter of the opening 322a of the absorption layer 322 is equal to or smaller than the diffraction limit of a projection optical system as an optical system TOS to be measured, e.g., about 100 nm, like the measurement mask 30A. The region (opening group) 322b in which the plurality of openings 322a are arrayed has a diameter Pw. The regions (opening groups) 322b in each of which a plurality of openings 322a are arrayed are formed in a matrix at the above-described pitch Pp. This makes it possible to prevent deterioration of the contrast of an interference pattern IP.

The feature of the measurement mask 30A is that the diameter Dw of the window 324Aa of the antireflection layer 324A coincides with a size A of a region in which reflection units 312 (openings 322a) are formed. Increasing the diameter Dw of the window 324Aa of the antireflection layer 324A allows the measurement apparatus 1 to be insensitive to errors generated upon fabricating the measurement mask 30A. This makes it possible to easily fabricate a measurement mask 30A using either of the above-described two fabrication methods.

Figure 11:
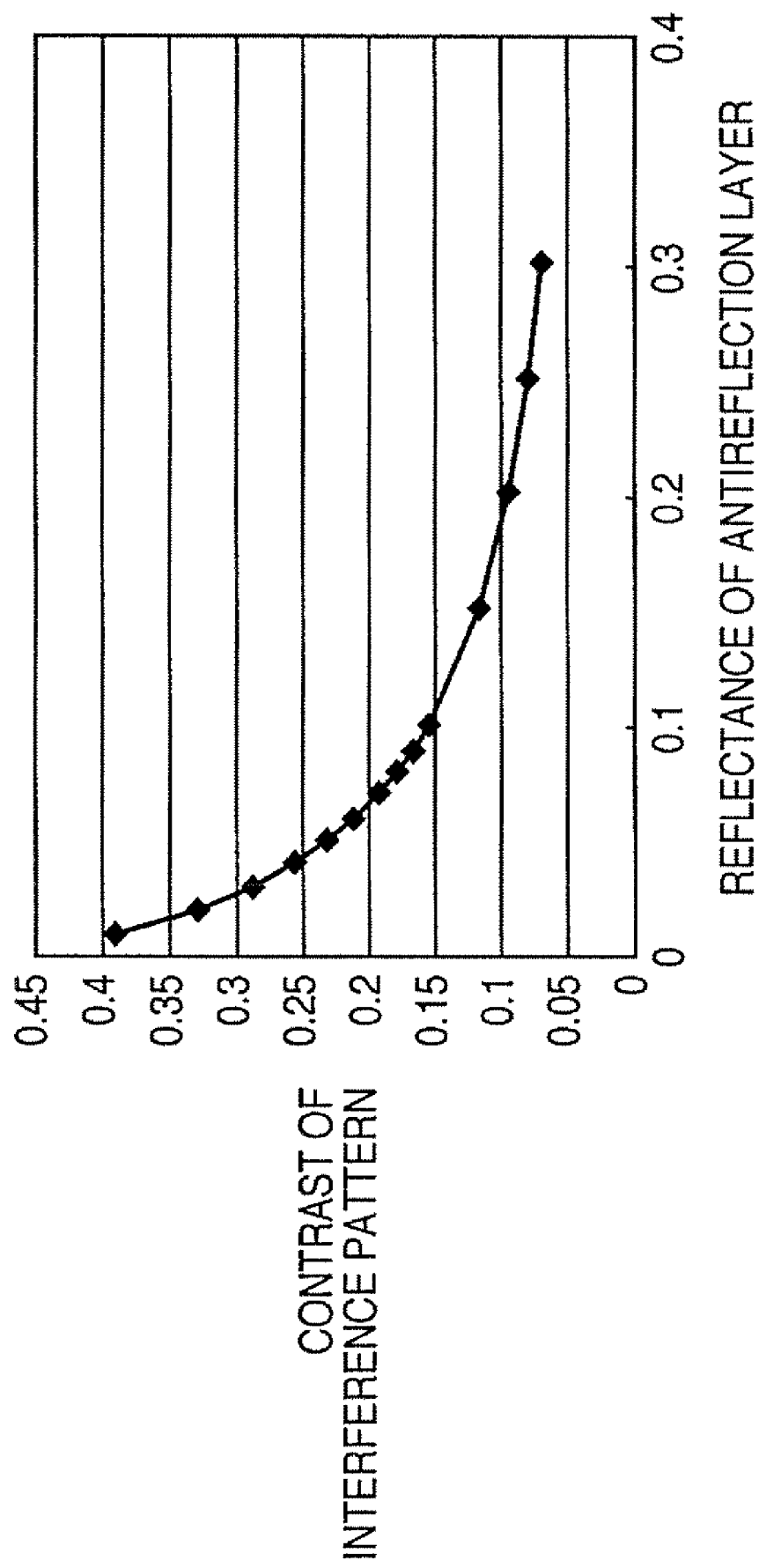
FIG. 11 is a graph showing the relationship between the reflectance of an antireflection layer of the measurement mask shown in FIGS. 9 and 10 and the contrast of an interference pattern on a detection unit.

FIG. 11 is a graph showing the relationship between the reflectance of the antireflection layer 324A and the contrast of the interference pattern IP on a detection unit 50. FIG. 11 exemplifies a case in which the diameter Pw of the region (opening group) 322b in which the plurality of openings 322a are arrayed is 2.1 µm, and the size A of the region in which the reflection units 312 (openings 322a) are formed is 200 µm. The area ratio of the plurality of openings 322a in the region in which they are arrayed is 0.1, and the diameter Dw of the window 324Aa is 200 µm. To restore the wavefront aberration (phase) of the optical system TOS to be measured, on the basis of the interference pattern IP without generating any errors, the interference pattern IP preferably has a contrast of 0.3 or more. If, however, the measurement apparatus fluctuates noise components by only small amounts, the wavefront aberration (phase) of the optical system TOS to be measured can sometimes be correctly restored even when the contrast of the interference pattern is about 0.2. Referring to the correspondence between the contrast of the interference pattern IP and the reflectance of the antireflection layer 324A shown in FIG. 11, it is necessary to use a measurement mask 30A in which the reflectance of the antireflection layer 324A is 0.06% or less at maximum and, preferably, 0.02% or less.

Consider an optimal thickness of the antireflection layer 324A of a measurement mask 30A in which a TaBN absorption layer 322 is formed on an Mo/Si multilayer film (40 layer pairs), and an Si antireflection layer 324A is formed on the TaBN. In this case, the thickness of the Si antireflection layer 324A must be 400 nm or more at minimum and, preferably, 750 nm or more to suppress its reflectance to 0.06% or less or 0.02% or less.

Similarly, consider an optimal thickness of the antireflection layer 324A of a measurement mask 30A in which a TaBN absorption layer 322 is formed on an Mo/Si multilayer film (40 layer pairs), and an $SiO_2$ antireflection layer 324A is formed on the TaBN. In this case, the thickness of the $SiO_2$ antireflection layer 324A must be 100 nm or more at minimum and, preferably, 300 nm or more.

In this manner, the light-shielding layer 320A of the measurement mask 30A is formed by two layers, i.e., the absorption layer 322 which absorbs the EUV light and the antireflection layer 324A which prevents the surface reflection of the EUV light. This makes it possible to reduce noise of the interference pattern IP detected by the detection unit 50. Hence, the measurement apparatus 1 can accurately measure the optical performances (wavefront aberration) of the optical system TOS to be measured.

Figure 12:
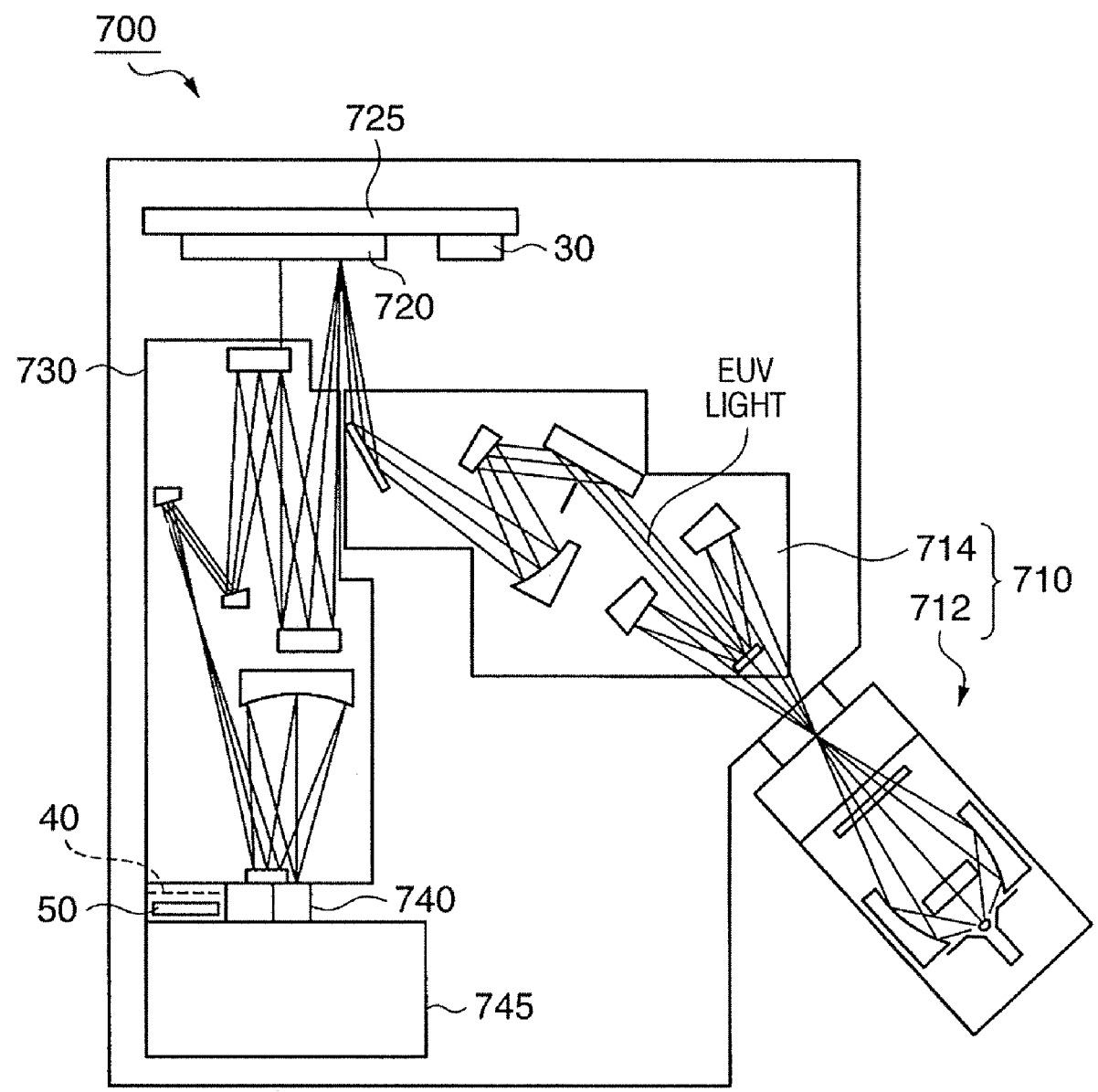
FIG. 12 is a schematic view of an exposure apparatus according to one aspect of the present invention.

An exposure apparatus 700 according to one aspect of the present invention will be explained next with reference to FIG. 12. FIG. 12 is a schematic sectional view showing the arrangement of the exposure apparatus 700. The exposure apparatus 700 is a projection exposure apparatus (EUV exposure apparatus) which transfers the pattern of a mask (reticle) 720 onto a wafer 740 by exposure using EUV light having a wavelength of 10 nm (inclusive) to 15 nm (inclusive) as exposure light, in accordance with a step & scan scheme. However, the exposure apparatus 700 can also adopt a step & repeat scheme. The exposure apparatus 700 includes an illumination apparatus 710, a mask stage 725 which supports the mask 720 and a measurement mask 30, a projection optical system 730, and a wafer stage 745 which supports the wafer 740 and a detection device including a diffraction grating 40 and detection unit 50. In the exposure apparatus 700, the illumination apparatus 710 (a light source unit 712 and illumination optical system 714), measurement mask 30, diffraction grating 40, and detection unit 50 constitute the above-described measurement apparatus 1. Although this embodiment will exemplify a case in which the measurement mask 30 is applied to the exposure apparatus 700, a measurement mask 30A is also applicable to the exposure apparatus 700.

The illumination apparatus 710 illuminates the measurement mask 30 and the mask 720 on which a circuit pattern to be transferred is formed, and comprises the light source unit 712 and illumination optical system 714.

The light source unit 712 includes a light source which emits EUV light. In this embodiment, the light source unit 712 uses a discharge produced plasma light source (DPP) which emits EUV light by changing Xe gas or Sn vapor to a plasma phase by electric discharge. However, the light source unit 712 may use a laser produced plasma light source (LPP).

The illumination optical system 714 guides the EUV light from the light source unit 712 to illuminate the mask 720 and measurement mask 30. The illumination optical system 714 includes, e.g., a parallel optical system, integrator, aperture stop, circular optical system, and plane mirror.

The mask 720 is a reflecting mask on which a circuit pattern to be transferred onto the wafer 740 is formed. The mask 720 is supported and driven by the mask stage 725. Diffracted light generated by the mask 720 is projected onto the wafer 740 upon being reflected by the projection optical system 730. Since the exposure apparatus 700 is of a step & scan scheme, it scans the mask 720 and wafer 740 to transfer the pattern of the mask 720 onto the wafer 740.

The mask stage 725 supports the mask 720 and measurement mask 30 and connects to a moving mechanism (not shown). The moving mechanism (not shown) includes, e.g., a linear motor and drives the mask stage 725 in the X-axis direction so as to move the mask 720 and measurement mask 30. In this embodiment, the mask stage 725 inserts the mask 720 on the object plane of the projection optical system 730 in exposure, while it inserts the measurement mask 30 on the object plane in measuring the wavefront aberration of the projection optical system 730.

The projection optical system 730 projects the pattern of the mask 720 onto the wafer 740. The measurement apparatus 1 which includes the illumination apparatus 710, measurement mask 30, diffraction grating 40, and detection unit 50 accurately measures the wavefront aberration of the projection optical system 730. The wavefront aberration is adjusted on the basis of the measurement result.

In this embodiment, the wafer 740 is used as the substrate. It is also possible to use other substrates such as a glass plate in place of the wafer 740. The wafer 740 is coated with a photoresist.

The wafer stage 745 supports the wafer 740 and the detection device including the diffraction grating 40 and detection unit 50, and drives the wafer 740 and detection device using, e.g., a linear motor. In this embodiment, the wafer stage 745 inserts the wafer 740 on the image plane of the projection optical system 730 in exposure, while it inserts the detection device including the diffraction grating 40 and detection unit 50 under the image plane of the projection optical system 730 in measuring the wavefront aberration of the projection optical system 730.

The measurement mask 30, diffraction grating 40, and detection unit 50 which constitute the measurement apparatus 1 for measuring the wavefront aberration of the projection optical system 730 can take any forms as described above, and a detailed description thereof will be omitted here.

First, the exposure apparatus 700 measures the wavefront aberration of the projection optical system 730. As described above, the wavefront aberration of the projection optical system 730 is measured using the illumination apparatus 710, measurement mask 30, diffraction grating 40, and detection unit 50 which constitute the measurement apparatus 1. As the wavefront aberration of the projection optical system 730 is measured, it is adjusted on the basis of the measurement result. As described above, the measurement apparatus 1 can accurately measure the wavefront aberration of the projection optical system 730 so as to accurately adjust it.

The pattern of the mask 720 is then transferred onto the wafer 740 by exposure. The illumination optical system 714 illuminates the mask 720 with the EUV light emitted by the light source unit 712. The projection optical system 730 images the light which reflects the pattern of the mask 720 on the wafer 740. As described above, since the wavefront aberration of the projection optical system 730 used for the exposure apparatus 700 is accurately adjusted, an excellent imaging capability is attained. Hence, the exposure apparatus 700 can provide devices (e.g., a semiconductor device, an LCD device, an image sensing device (e.g., a CCD), and a thin-film magnetic head) with high throughput, high quality, and a good economical efficiency.

Figure 13:
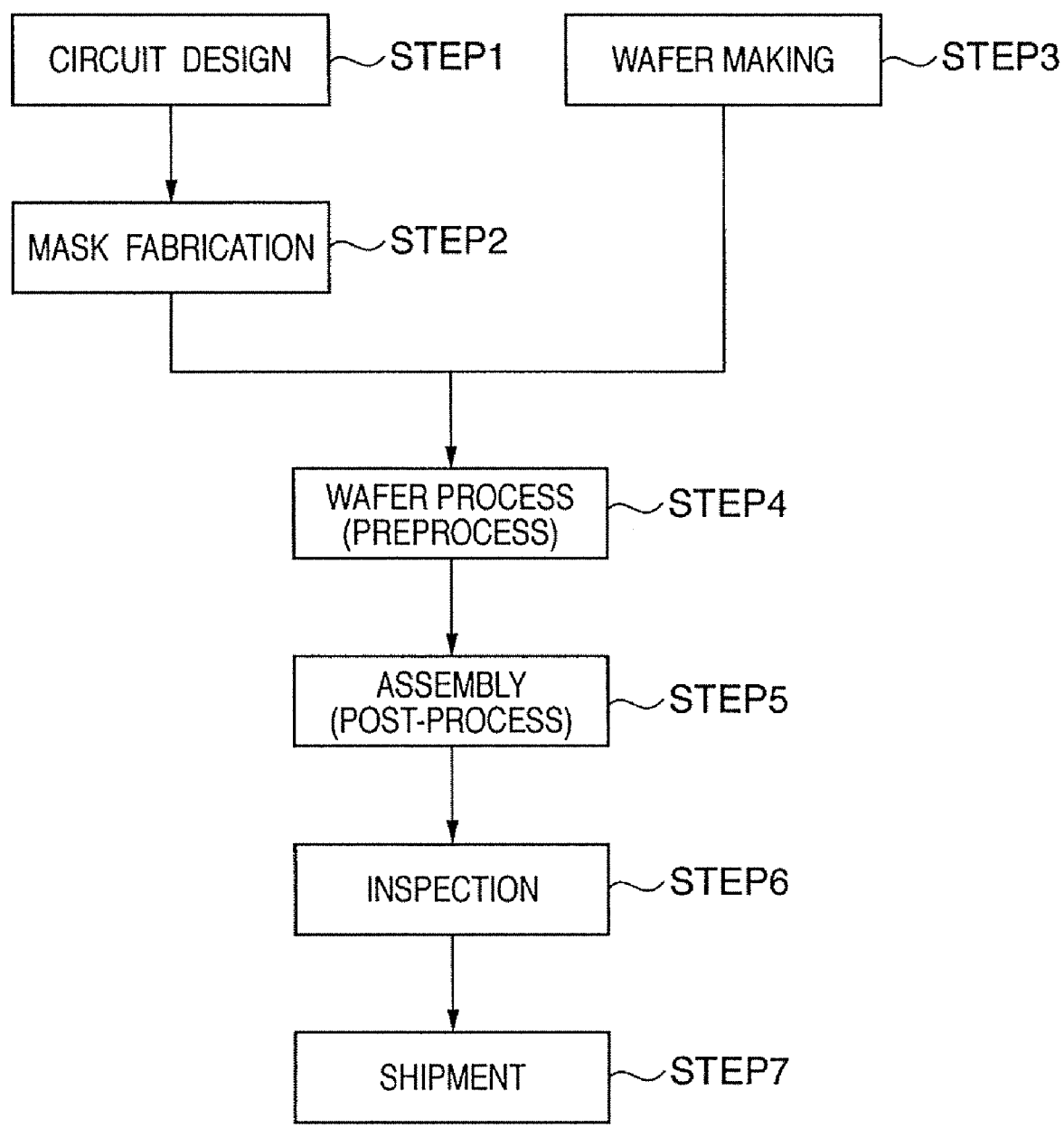
FIG. 13 is a flowchart for explaining a method for fabricating devices.
Figure 14:
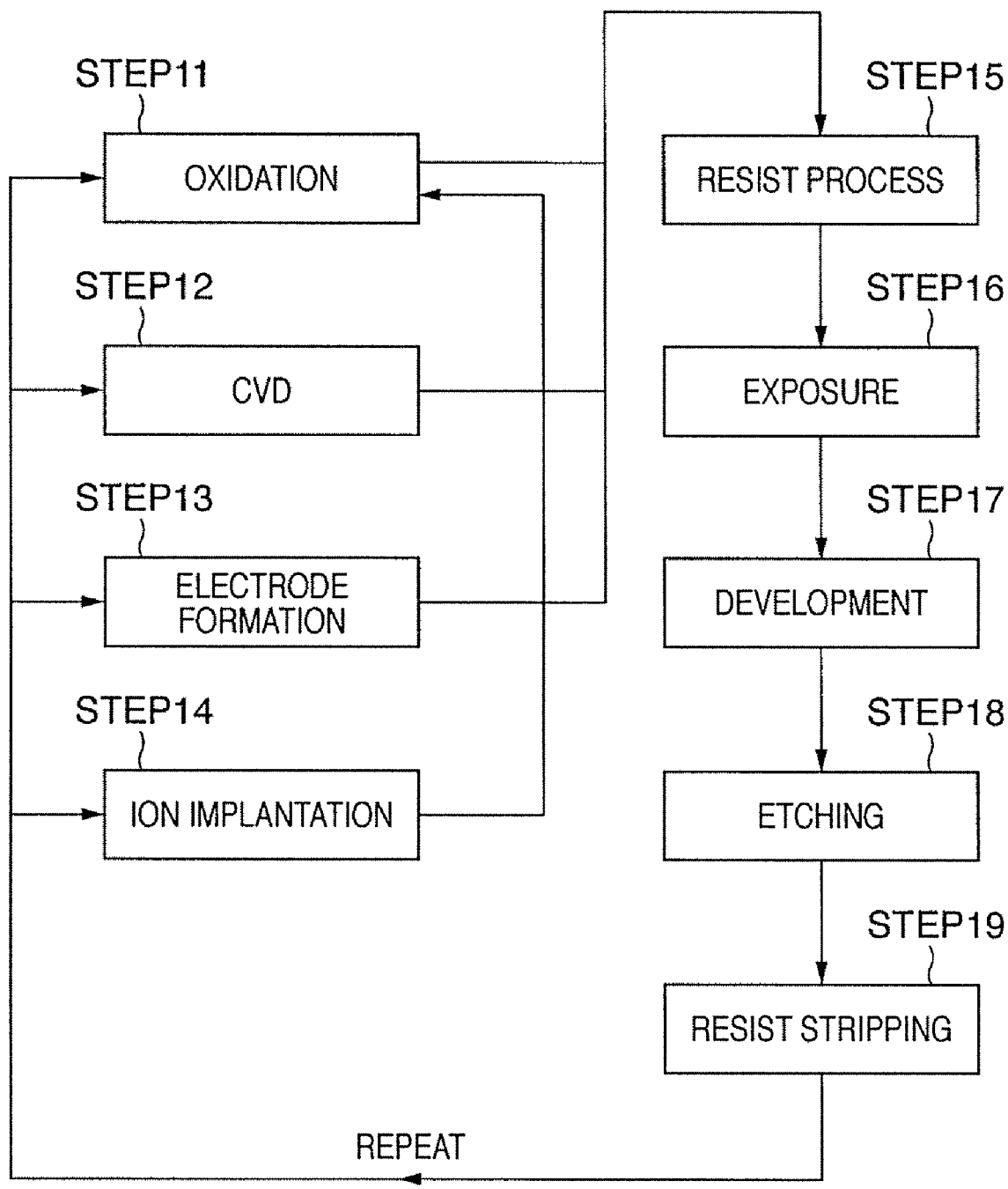
FIG. 14 is a detail flowchart of a wafer process in Step 4 of FIG. 13.

Referring now to FIGS. 13 and 14, a description will be given of an embodiment of a device fabrication method using the above mentioned exposure apparatus 700. FIG. 13 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 700 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 700, and resultant devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese application No. 2007-027372 filed on Feb. 6, 2007, which is hereby incorporated by reference herein in its entirely.

What is claimed is:

1. A measurement apparatus which measures a wavefront aberration of an optical system to be measured, the apparatus comprising:
   a measurement mask which is inserted on an object plane of the optical system to be measured, and includes a plurality of reflection units configured to generate spherical waves by reflecting light;
   a diffractive optical element configured to diffract the light having passed through said measurement mask and the optical system to be measured; and
   a detection unit configured to detect an interference pattern formed by interference of the light diffracted by said diffractive optical element,
   said measurement mask including:
   a reflection layer configured to reflect the light,
   a first layer which is stacked on said reflection layer, has a plurality of openings, and is made of a first substance, and
   a second layer which is stacked on said first layer, has a window configured to expose a region in which said plurality of openings are arrayed, and is made of a second substance different from said first substance,
   wherein said plurality of reflection units are formed by portions of said reflection layer, which are exposed through said plurality of openings.

2. The apparatus according to claim 1, wherein said second layer has a plurality of windows each of which are configured to expose a corresponding one of a plurality of regions in which said plurality of openings are arrayed.

3. The apparatus according to claim 1, wherein said second layer has a window configured to collectively expose a plurality of regions in which said plurality of openings are arrayed.

4. The apparatus according to claim 1, wherein said first substance contains one member selected from the group consisting of Ni, Ta, TaBN, and Cr.

5. The apparatus according to claim 1, wherein said second substance contains one member selected from the group consisting of Si and $SiO_2$.

6. An exposure apparatus comprising:
   an illumination optical system configured to illuminate a mask with light from a light source;
   a projection optical system configured to project a pattern of the mask onto a substrate; and
   a measurement apparatus defined in claim 1,
   wherein said measurement apparatus measures a wavefront aberration of said projection optical system as an optical system to be measured.

7. The apparatus according to claim 6, wherein a wavelength of the light from the light source is 10 nm or more and 15 nm or less.

* * * * *